United States Patent
Keaton et al.

(10) Patent No.: US 8,009,705 B2
(45) Date of Patent: Aug. 30, 2011

(54) FIBER MOPA SYSTEM WITHOUT STIMULATED BRILLOUIN SCATTERING

(75) Inventors: Gregory L. Keaton, San Francisco, CA (US); Manuel J. Leonardo, San Francisco, CA (US)

(73) Assignee: Mobius Photonics, Inc., Santa Clara, CA (US)

( * ) Notice: Subject to any disclaimer, the term of this patent is extended or adjusted under 35 U.S.C. 154(b) by 253 days.

(21) Appl. No.: 11/773,934

(22) Filed: Jul. 5, 2007

(65) Prior Publication Data

US 2009/0010288 A1    Jan. 8, 2009

(51) Int. Cl.
*H01S 3/30* (2006.01)

(52) U.S. Cl. ........... 372/6; 372/22; 372/25; 372/29.015; 372/29.021

(58) Field of Classification Search ................ 372/6, 22, 372/25, 29.015, 29.021
See application file for complete search history.

(56) References Cited

U.S. PATENT DOCUMENTS

| | | | |
|---|---|---|---|
| 5,359,450 A | 10/1994 | Ramachandran et al. | 398/194 |
| 5,745,284 A | 4/1998 | Goldberg et al. | 359/344 |
| 6,151,338 A | 11/2000 | Grubb et al. | 372/6 |
| 6,281,471 B1 | 8/2001 | Smart | 219/121.62 |
| 6,297,903 B1 | 10/2001 | Grubb et al. | 359/341.3 |
| 6,331,908 B1 | 12/2001 | Adams et al. | 398/200 |
| 6,335,941 B1 | 1/2002 | Grubb et al. | 372/6 |
| 6,340,806 B1 | 1/2002 | Smart et al. | 219/121.62 |
| 6,541,731 B2 | 4/2003 | Mead et al. | 219/121.7 |
| 6,590,698 B1 | 7/2003 | Ohtsuki et al. | 359/326 |
| 6,678,294 B1 * | 1/2004 | Komine et al. | 372/38.01 |
| 6,703,582 B2 | 3/2004 | Smart et al. | 219/121.62 |
| 6,711,187 B2 | 3/2004 | Tanner et al. | 372/30 |
| 6,727,458 B2 | 4/2004 | Smart | 219/121.62 |
| 6,853,786 B2 | 2/2005 | Russell et al. | |
| 6,917,631 B2 * | 7/2005 | Richardson et al. | 372/5 |
| 7,039,076 B2 | 5/2006 | Kane et al. | 372/6 |
| 7,167,621 B2 | 1/2007 | Manyam et al. | 385/123 |
| 7,477,667 B2 * | 1/2009 | Liu | 372/25 |
| 7,529,281 B2 * | 5/2009 | Leonardo et al. | 372/22 |
| 7,764,719 B2 | 7/2010 | Munroe et al. | |
| 2004/0052278 A1 * | 3/2004 | Kane et al. | 372/25 |
| 2004/0120363 A1 | 6/2004 | Siepmann | |
| 2005/0036525 A1 * | 2/2005 | Liu | 372/6 |
| 2005/0041702 A1 | 2/2005 | Fermann et al. | |
| 2006/0093294 A1 * | 5/2006 | Manyam et al. | 385/123 |

(Continued)

OTHER PUBLICATIONS

International Search Report and Written Opinion of the International Searching Authority dated Sep. 3, 2008—International Patent Application No, PCT/US08/69081.

(Continued)

*Primary Examiner* — Jessica Stultz
*Assistant Examiner* — Yuanda Zhang
(74) *Attorney, Agent, or Firm* — Joshua D. Isenberg; JDI Patent

(57) ABSTRACT

Methods and systems for increasing the threshold for stimulated Brillouin scattering are described. A seed source may generate one or more chirped seed pulses characterized by a pulse duration $\tau$, and a frequency chirp. The pulse duration $\tau$ may be greater than about 2 nanoseconds. A photonic crystal amplifier amplifies the seed pulses to produce one or more amplified pulses characterized by a peak power P greater than about 1 kilowatt. The pulse duration $\tau$, frequency chirp, and the photonic crystal fiber may be selected such that a threshold for stimulated Brillouin scattering (SBS) in the photonic crystal fiber is greater than the peak power P.

41 Claims, 7 Drawing Sheets

U.S. PATENT DOCUMENTS

2007/0041083 A1\* 2/2007 Di Teodoro et al. .......... 359/333
2008/0013163 A1\* 1/2008 Leonardo et al. ........ 359/341.31
2009/0080477 A1 3/2009 Murison et al.

OTHER PUBLICATIONS

Brooks et at., 1-mj energy, 1-mw peak-power, 10-w average-power spectrally narrow, diffraction-limited pulses from a protonic-crystal fiber amplifier. Optics Express. vol. 13 No. 22. Oct. 31, 2005 8999-9002.

Dane et al., High-Energy SBS Pulse Compression. IEEE Journal of Quantum Electronics. vol. 30, No. 8, Aug. 1994 1907-1915.

Endfiz et al., High Power Diode Laser Arrays. IEEE Journal of Quantum—Electronics. vol. 28, No. 4, Apr. 1992 952-965.

McCulloch at al., Influence of number density and transition cross-section on rapid passage effects in pulse quantum-cascade laser based spectrometers. Conference on Lasers and Electro-optics, Optical Society of America. 2004.

U.S. Appl. No. 60/885,604, filed Jan. 18, 2007 by Murison et al.

Govind P. Agrawal, "Nonlinear Fiber Optics", Third Edition, Chapter 9, Stimulated Brillouin Scattering, pp. 355-388, Academic Press, San Diego, California, 2001.

Lourtioz, J. M. et. al., "Fourier-Transform-Limited Pulses from Gain-Switched Distributed-Bragg-Reflector Lasers using Simultaneous Modulation of Gain and Phase Sections", Electronic Letters, Jul. 30, 1992, vol. 28, No. 16, pp. 1499-1500.

Champert P. A., et. al., "3.5 W frequency-doubled fiber-bsed laser source at 772 nm", Applied Physics Letters, Apr. 23, 2001, vol. 78, No. 17, pp. 2420-2421.

EagleYard Photonics GmbH datasheet—EYP-DBR-1063-00025-2000-BFY01-0001, 2006.

EagleYard Photonics GmbH datasheet—EYP-DFB-1060-00040-1500-BFY01-0000, 2006.

Crystal Fibre A/S datasheet—Polarizing Double Clad High NA Yb Fiber—DC-200-41-PZ-Yb, 2005.

Crystal Fibre A/S datasheet—Polarizing Double Clad High NA Yb Fiber—DC-200-41-PZ-Yb-3, 2005.

P.G. Kazansky et al. "Blue-Light Generation by Quasi-Phase-Matched Frequency Doubling in Thermally Poled Optical Fibers", Optics Letters, Apr. 15, 1995, vol. 20, No. 8, pp. 843-845.

Fabio Di Teodoro and Christopher D. Brooks "1.1 MW peak-power, 7 W average-power, high-spectral-brightness, diffraction-limited pulses from a photonic crystal fiber amplifier" in Optics Letters / vol. 30, No. 20 / Oct. 15, 2005 pp. 2694-2696, published by Optical Society of America.

J. Limpert, A. Liem, M. Reich, T. Schreiber, S. Nolte, H. Zellmer, A. Tünnermann "Low-nonlinearity single-transverse-mode ytterbium-doped photonic crystal fiber amplifier" in Optics Express, vol. 12, No. 7, Apr. 5, 2004, pp. 1313-1319, published by Optical Society of America.

U.S. Appl. No. 60/948,404 filed Jul. 6, 2007 by Michael J. Monroe et al.

\* cited by examiner

FIBER MOPA SYSTEM WITHOUT STIMULATED BRILLOUIN SCATTERING

FIELD OF THE INVENTION

This invention generally relates to lasers and optical amplifiers and more particularly to wavelength converted optical systems with high peak powers and pulse energies suitable for material processing applications.

BACKGROUND OF THE INVENTION

High-powered optical sources have many applications in which an intense beam of light is focused onto a substrate or other target. In many high-power optical source architectures, a signal from a seed source is fed into an optical amplifier that amplifies the power of the signal. One example, among others, of such a high-power optical source architecture is referred as a master oscillator, power amplifier (MOPA) architecture. The MOPA architecture allows precise pulsing of the amplified output. Laser systems based on optical amplification of seed signals are often used in high power applications, such as laser micromachining.

Many high power optical systems make use of wavelength conversion to produce light having a desired wavelength or range of wavelengths. Often the process of conversion involves performing some non-linear optical wavelength conversion on input light from a source, such as a MOPA source. Conventional fiber MOPA system typically cannot support high peak powers for pulse widths longer than about 1.7 ns. For example, U.S. Pat. No. 7,039,076 to Kane et al. describes limitations on peak power for a fiber amplifier system as a function of pulse width. As seen from FIG. 1, peak power decreases abruptly as pulse width increases above about 1.7 nanoseconds. In addition, the use of a passively Q-switch master oscillator, as described in U.S. Pat. No. 7,039,076 offers limited flexibility to vary pulse repetition rate and pulse width. However, there are a number of applications involving both MOPA architecture and wavelength conversion that could benefit from longer pulse durations.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Figure 1:
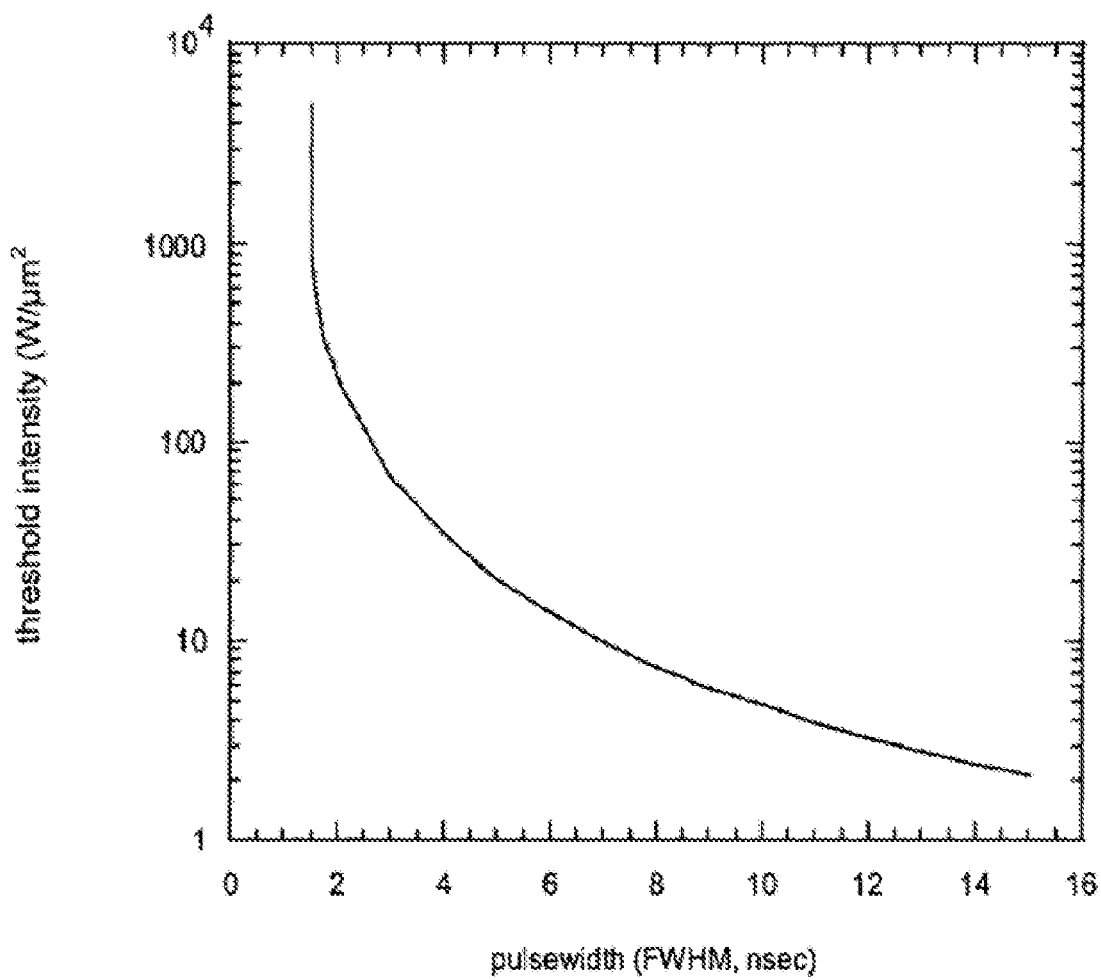
FIG. 1 is a graph illustrating a relationship between peak power and pulse width in a MOPA system of the prior art.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

GLOSSARY

As used herein:

The indefinite article "A", or "An" refers to a quantity of one or more of the item following the article, except where expressly stated otherwise.

Beam splitter refers to an optical device capable of splitting a beam of light into two or more parts.

Brillouin scattering refers to a nonlinear optical phenomenon involving spontaneous scattering of light in a medium due to interaction between the light and sound waves passing through the medium.

Cavity or Optically Resonant Cavity refers to an optical path defined by two or more reflecting surfaces along which light can reciprocate or circulate. Objects that intersect the optical path are said to be within the cavity.

Chirp (or "frequency chirp") refers to a rapid change, as opposed to a long-term drift, in the emission wavelength of an optical source.

Continuous wave (CW) laser refers to a laser that emits radiation continuously rather than in short bursts, as in a pulsed laser.

Duty Cycle (D) refers to the product of the pulse duration $\tau$ and the pulse repetition frequency (PRF) for pulses that occur at regular intervals. The duty cycle may be expressed as a ratio, for example, 0.01 or equivalently may be expressed as a percentage, for example 1%.

Diode Laser refers to a light-emitting diode designed to use stimulated emission to generate a coherent light output. Diode lasers are also known as laser diodes or semiconductor lasers.

Diode-Pumped Laser refers to a laser having a gain medium that is pumped by a diode laser.

Gain refers to an increase in intensity, power, or pulse energy of a signal that is transmitted from one point to another through a medium.

Gain Medium refers to a lasable material as described below with respect to a Laser.

Garnet refers to a particular class of oxide crystals, including e.g., yttrium aluminum garnet (YAG), gadolinium gallium garnet (GGG), gadolinium scandium gallium garnet (GSGG), yttrium scandium gallium garnet (YSGG) and similar.

Includes, including, e.g., "such as", "for example", etc., "and the like" may, can, could and other similar qualifiers used in conjunction with an item or list of items in a particular category means that the category contains the item or items listed but is not limited to those items.

Infrared Radiation refers to electromagnetic radiation characterized by a vacuum wavelength between about 700 nanometers (nm) and about 100,000 nm.

Laser is an acronym of light amplification by stimulated emission of radiation. A laser is a cavity that is contains a lasable material. This is any material—crystal, glass, liquid, semiconductor, dye or gas—the atoms of which are capable of being excited to a metastable state by pumping e.g., by light or an electric discharge. Light is emitted from the metastable state by an atom as it drops back to the ground state. The light emission is stimulated by the presence by a passing photon, which causes the emitted photon to have the same phase and direction as the stimulating photon. The light (referred to herein as stimulated radiation) oscillates within the cavity, with a fraction ejected from the cavity to form an output beam.

Light: As used herein, the term "light" generally refers to electromagnetic radiation in a range of frequencies running from infrared through the ultraviolet, roughly corresponding to a range of vacuum wavelengths from about 1 nanometer ($10^{-9}$ meters) to about 100 microns.

Mode-Locked Laser refers to a laser that functions by controlling the relative phase (sometimes through modulation with respect to time) of each mode internally to give rise selectively to energy bursts of high peak power and short duration, e.g., in the picosecond ($10^{-12}$ second) domain.

Nonlinear effect refers to a class of optical phenomena that can typically be viewed only with nearly monochromatic, directional beams of light, such as those produced by a laser. Higher harmonic generation (e.g., second-, third-, and fourth-harmonic generation), optical parametric oscillation, sum-frequency generation, difference-frequency generation, optical parametric amplification, and the stimulated Raman Effect are examples of non-linear effects.

Nonlinear Optical Wavelength Conversion Processes are non-linear optical processes whereby input light of a given vacuum wavelength $\lambda_0$ passing through a non-linear medium interacts with the medium and/or other light passing through the medium in a way that produces output light having a different vacuum wavelength than the input light. Nonlinear wavelength conversion is equivalent to nonlinear frequency conversion, since the two values are related by the vacuum speed of light. Both terms may be used interchangeably. Nonlinear Optical Wavelength conversion includes:

Higher Harmonic Generation (HHG), e.g., second harmonic generation (SHG), third harmonic generation (THG), fourth harmonic generation (FHG), etc., wherein two or more photons of input light interact in a way that produces an output light photon having a frequency $Nf_0$, where N is the number of photons that interact. For example, in SHG, N=2.

Sum Frequency Generation (SFG), wherein an input light photon of frequency $f_1$ interacts with another input light photon of frequency $f_2$ in a way that produces an output light photon having a frequency $f_1+f_2$.

Difference Frequency Generation (DFG), wherein an input light photon of frequency $f_1$ interacts with another input light photon of frequency $f_2$ in a way that produces an output light photon having a frequency $f_1-f_2$.

Nonlinear Material refers to materials that possess a non-zero nonlinear dielectric response to optical radiation that can give rise to non-linear effects. Examples of non-linear materials include crystals of lithium niobate ($LiNbO_3$), lithium triborate (LBO), beta-barium borate (BBO), Cesium Lithium Borate (CLBO), KDP and its isomorphs, $LiIO_3$, as well as quasi-phase-matched materials, e.g., PPLN, PPSLT, PPKTP and the like. Optical fiber can also be induced to have a non-linear response to optical radiation by fabricating microstructures in the fiber.

Optical Amplifier refers to an apparatus that amplifies the power of an input optical signal. An optical amplifier is similar to a laser in that it uses a gain medium driven by pumping radiation. The amplifier generally lacks feedback (i.e. a cavity), so that it has gain but does not oscillate. As used herein an optical power amplifier generally refers to the last optical amplifier before delivery of an amplified beam to a target or a wavelength converter. An amplifier stage between a source of radiation and a power amplifier is generally referred to herein as a preamplifier.

Phase-Matching refers to the technique used in a multi-wave nonlinear optical process to enhance the distance over which the coherent transfer of energy between the waves is possible. For example, a three-wave process is said to be phase-matched when $k_1+k_2=k_3$, where $k_i$ is the wave vector of the $i^{th}$ wave participating in the process. In frequency doubling, e.g., the process is most efficient when the fundamental and the second harmonic phase velocities are matched. Typically the phase-matching condition is achieved by careful selection of the optical wavelength, polarization state, and propagation direction in the non-linear material.

Pulse Duration ($\tau$) refers to the temporal duration or lifetime of a repetitive signal, e.g., the time interval between the half-power points on the leading and trailing edges of the pulse. Pulse duration is sometimes referred to as "pulse width".

Pulse Energy refers to the amount of energy in a pulse. Pulse energy may be calculated by integrating instantaneous pulse power over the pulse period.

Pulse Period (T) refers to the time between equivalent points of successive pulses in a train of two or more pulses.

Pulse Repetition Frequency (PRF) refers to the rate of repetition of pulses per unit time. The PRF is inversely related to the period T, e.g., PRF=1/T.

Q refers to the figure of merit of a resonator (cavity), defined as ($2\pi$)×(average energy stored in the resonator)/(energy dissipated per cycle). The higher the reflectivity of the surfaces of an optical resonator and the lower the absorption losses, the higher the Q and the less energy loss from the desired mode.

Q-switch refers to a device used to rapidly change the Q of an optical resonator.

Q-switched Laser refers to a laser that uses a Q-switch in the laser cavity to prevent lasing action until a high level of inversion (optical gain and energy storage) is achieved in the lasing medium. When the switch rapidly increases the Q of the cavity, e.g., with acousto-optic or electro-optic modulators or saturable absorbers, a giant pulse is generated.

Quasi-CW refers to generating a succession of pulses at a high enough repetition rate to appear continuous.

Quasi Phase-matched (QPM) Material: In a quasi-phase-matched material, the fundamental and higher harmonic radiation are phase-matched by periodically changing the sign of the material's non-linear coefficient. The period of the sign change ($k_{QPM}$) adds an additional term to the phase matching equation such that $k_{QPM}+k_1+k_2=k_3$. In a QPM material, the fundamental and higher harmonic can have identical polarizations, often improving efficiency. Examples of quasi-phase-matched materials include periodically-poled lithium tantalate (PPLT), periodically-poled lithium niobate (PPLN), periodically poled stoichiometric lithium tantalate (PPSLT), periodically poled potassium titanyl phosphate (PPKTP) or periodically poled microstructured glass fiber.

Raman Scattering refers to a scattering of incident light by matter in which the scattered light has a lower frequency than the incident light. The difference between the frequencies of the incident and scattered light (referred to as the Raman shift) corresponds to a natural vibrational frequency of the scattering material.

Saturation of an optical amplifier refers to a decrease of the gain coefficient of a medium near some transition frequency when the power of the incident radiation near that frequency exceeds a certain value. If the gain coefficient is constant, the power emitted by the medium is proportional to the incident power. However, there is typically a limit to the rate at which a gain medium can emit power. This limit depends on the lifetimes of the energy levels involved. As this limit is reached, the stimulated transitions become rapid enough to significantly lower the upper energy level population, thereby decreasing the gain coefficient. The effect is to "flatten" the amplified power as a function of input power.

Saturation Intensity ($I_{sat}$): The intensity which reduces the gain of an amplifier to half of its small-signal value. An amplifier is said to be saturated if the signal intensity passing through the amplifier is significantly larger than the saturation intensity.

Stimulated Brillouin Scattering (SBS) refers to a type of amplification process in which intense light causes deformation of a crystal lattice that generates ultrasonic waves in the lattice. The Brillouin-scattered light experiences gain and its power increases exponentially. If the power of the incident light exceeds a threshold value, a large portion of the incident light is converted to Brillouin-scattered light having a lower frequency than the incident light.

Stimulated Raman Scattering (SRS) is a type of Raman scattering that can occur with an intense optical beam. The Raman-scattered light experiences gain and its power increases exponentially. If the power of the incident light exceeds a threshold value, a large portion of the incident light is converted to Raman-scattered light having a lower frequency than the incident light. SRS is also sometimes known as the stimulated Raman effect or coherent Raman effect.

Ultraviolet (UV) Radiation refers to electromagnetic radiation characterized by a vacuum wavelength shorter than that of the visible region, but longer than that of soft X-rays. Ultraviolet radiation may be subdivided into the following wavelength ranges: near UV, from about 380 nm to about 200 nm; far or vacuum UV (FUV or VUV), from about 200 nm to about 10 nm; and extreme UV (EUV or XUV), from about 1 nm to about 31 nm.

Vacuum Wavelength: The wavelength of electromagnetic radiation is generally a function of the medium in which the wave travels. The vacuum wavelength is the wavelength electromagnetic radiation of a given frequency would have if the radiation were propagating through a vacuum and is given by the speed of light in vacuum divided by the frequency.

DESCRIPTION

In embodiments of the present invention, a seed source may generate one or more chirped input pulses characterized by a pulse duration τ and a frequency chirp. The pulse duration τ is greater than about 2 nanoseconds (e.g., greater than about 1.7 nanoseconds). A photonic crystal amplifier amplifies the input pulses to produce one or more amplified pulses characterized by a peak power P greater than about 1 kilowatt. The pulse duration τ and the photonic crystal fiber are selected such that a threshold for stimulated Brillouin scattering (SBS) in the photonic crystal fiber is greater than the peak power P.

In alternative embodiments, the chirped input pulses may be further characterized by a characteristic vacuum wavelength λ, a spectral linewidth δf, a pulse duration τ, an amount of frequency shift Δf and frequency shift rate (also known as a "chirp rate") Δf/Δt. The pulse duration τ is greater than about 2 nanoseconds (e.g., greater than about 1.7 nanoseconds). A photonic crystal amplifier amplifies the input pulses to produce one or more amplified pulses characterized by a peak power P greater than about 1 kilowatt. The values of λ, δf, τ, Δf, Δf/Δt and the photonic crystal fiber may be selected such that a threshold for stimulated Brillouin scattering (SBS) in the photonic crystal fiber is greater than the peak power P.

Figure 2:
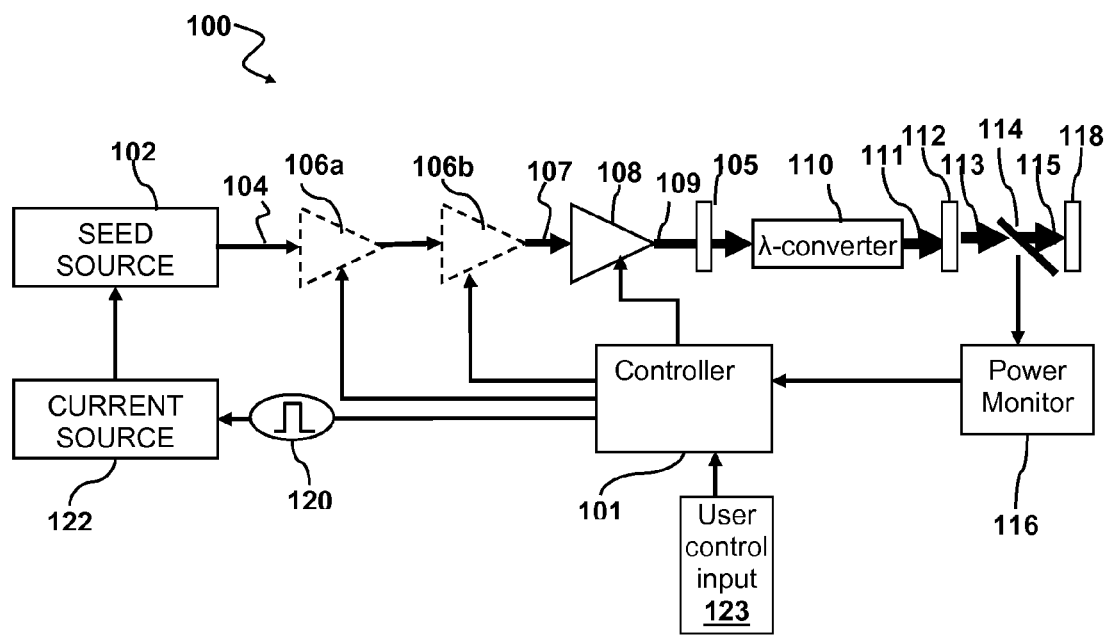
FIG. 2 is a schematic of an overall fiber MOPA system with harmonic conversion according to an embodiment of the present invention.

FIG. 2 depicts a wavelength-converted optical system 100 and method according to an embodiment of the present invention. Specifically, the system 100 generally includes a controller 101, a seed source 102, one or more optional optical amplifiers, 106a and 106b, a power amplifier 108 and a wavelength converter 110. The seed source 102 generates seed radiation 104, which may be amplified by optional preamplifiers 106a and 106b to generate an input signal 107 which is further amplified in power amplifier 108 to produce an amplified output 109. Alternatively, the pre-amplifiers may be omitted and the seed radiation 104 may be used as the input signal 107. As is well known in the art bandpass filters and optical isolators may be placed between the amplifier stages to prevent backward propagating beams and minimize the effects of unseeded spontaneous emission The amplified output 109 from the optical power amplifier 108 is optically coupled to the wavelength converter 110. The wavelength converter 110 wavelength converts at least a portion of the amplified output 109 to produce a wavelength converted output 111. In some embodiments of the invention, the system 100 may include coupling optics 105 that receive the amplified output 109 from the optical amplifier 108 and transmit it to the wavelength converter 110. In some embodiments the wavelength converter may not be required.

The system 100 may also include coupling optics 112 that receive the wavelength-converted output 111 and transmit a final output 113. The coupling optics 112 may include simple windows and may also include an optical fiber.

The controller 101 may be operably coupled to the seed source 102 and/or optional optical preamplifiers 106a and 106b, power amplifier 108, and/or wavelength converter 110. The controller may include logic adapted to control the pulse characteristics of the seed radiation 104, such as the pulse width τ, and pulse repetition frequency of seed source 102. By way of example, where the seed source 102 is a semiconductor diode laser, controller 101 may send control signals 120 to an electrical drive circuit 122 used to pump the seed source. The control signals 120 may be configured to adjust the operating parameters of the electrical drive circuit 122. In alternative embodiments, the seed source radiation 104 may be spectrally controlled through actuators on the seed source e.g., applying a current pulse which heats the grating section of a DBR laser used as the seed source 102. The controller 101 may adjust the wavelength-converted average power and/or pulse energy in response to user control inputs 123. In some embodiments, the system controller 101 may operate in response to one or more feedback signals. For example, a portion of the final output 113 may be deflected, e.g., by a beamsplitter 114 to a power monitor 116. A remaining output 115 may be coupled to a target 118. Alternatively, the final output 113 may be coupled directly to the target 118.

The final output 113 or remaining output 115 may be delivered to any of a number of different types of targets to implement any of a number of different types of processes depending on the application. Applications for the system 100 include, but are not limited to, material processing, medical treatments, laser particle accelerators, and wafer inspection. Examples of suitable materials for the target 118 include, but are not limited to, metals, ceramics, semiconductors, polymers, composites, thin films, organic materials, in vitro or in vivo biological samples, and elementary particles. In the particular case of material processing, targets may include, e.g., wires, printed circuit (PC) boards, integrated circuit (IC) packages, IC wafers dies, LED wafers, packages, dies and the like. Examples of material processing applications include surface texturing, heat treatment, surface engraving, fine micro-machining, surface ablation, cutting, grooving, bump forming, coating, soldering, brazing, sintering, sealing, welding, link blowing, wafer scribing, dicing and marking, via drilling, memory repair, flat panel display repair, stereolithography, maskless lithography, surface diffusion and surface conversion to a compound.

In addition to the above-mentioned components, the optical system 100 may further include other optical components that are well known in the art. Such components may include optical isolators to avoid deleterious effects of back reflection of the seed radiation 104, amplified output 109, final output 113 or remaining output 115. Other examples of optical components include, but are not limited to, spectral filters to avoid deleterious effects of amplified spontaneous emission (ASE) and waveplates to rotate the polarization state of the seed radiation 104, amplified output 109, final output 113 or remaining output 115 to a desired orientation. Alternatively seed source 102 could be a source with sufficiently broad intrinsic bandwidth that chirping is not required, e.g. an amplified stimulated emission (ASE source). In some embodiments, the combination of a broad intrinsic bandwidth seed source 102 and a photonic crystal fiber amplifier 108 (with or without pre-amplifiers) may provide a sufficient increase in SBS threshold for reasons discussed below. By way of example, the ASE source may be a DFB laser run below its lasing threshold.

The seed source 102 generates the seed radiation 104 in the form of one or more seed pulses. To increase the threshold for Stimulate Brillouin Scattering (SBS) the seed radiation 104 is frequency chirped. The seed source 102 includes a semiconductor laser and seed radiation 104 is in the form of coherent light. The seed radiation 104 produced by the seed source 102 may be in the near-IR or visible portions of the electromagnetic spectrum. For example, the seed radiation 104 may be characterized by a vacuum wavelength in a range from about 630 nm to about 3000 nm. Optical signals having wavelengths within this range may be obtained with a variety of semiconductor lasers fabricated on different substrates.

There are a number of different possible designs for the seed source 102. For example, the seed source 102 may be a semiconductor diode laser, such as a Distributed Feedback (DFB) or Distributed Bragg Reflector (DBR) type semiconductor diode laser. Semiconductor lasers may be pumped by driving electric current through the diode. By way of example, and without limitation, in the case of a DBR laser, the seed source 102 may have a specified continuous wave (cw) output power of about 25 milliwatts (mW), a maximum forward operating current of about 220 milliamperes (mA), a maximum phase operating current of about 50 mA, and a maximum grating operating current of about 100 mA. Examples of suitable commercially available DBR type lasers include, among others, Model #EYP-DBR-1063-00025-2000-BFY01-0001 lasers available from Eagleyard Photonics of Berlin, Germany.

By way of example, and without limitation, in the case of a DFB laser, the seed source 102 may have a specified cw output power of about 40 mW, a forward operating current of about 250 mA, and a linewidth of less than about 10 MHz. Examples of suitable DFB type lasers include, among others, Model #EYP-DFB-1060-00040-BFY01-0000 lasers, also available from Eagleyard Photonics of Berlin, Germany.

Narrow cw linewidths for lasers such as DFB and DBR lasers may be unsuitable for high power amplification since the threshold for SBS may be too low. However, pulsed operation of the laser may be used to cause the frequency of the seed radiation 104 to shift during the pulse duration $\tau$. The shifting of the seed radiation may have an effect on the Stimulated Brillouin Scattering threshold of the power amplifier 108 similar to a broadening of the spectrum of the seed radiation. Specifically, if the frequency shift is large enough and rapid enough, the shifting may increase the SBS threshold of the power amplifier 108 as would be expected to occur for a broadening of the spectrum of the seed radiation 104. Thus, frequency chirping the seed pulses 104 may be used to allow a narrow linewidth light source to be used as the seed source 102. A particular advantage of semiconductor lasers such as DFB and DBR lasers within the context of embodiments of the present invention is that their outputs may be chirped simply by pulsing the drive current used to pump the laser. Furthermore, the pulse duration $\tau$ of the seed radiation 104 may be varied simply by adjusting the duty cycle and/or pulse repetition frequency of the drive current.

Figure 3:
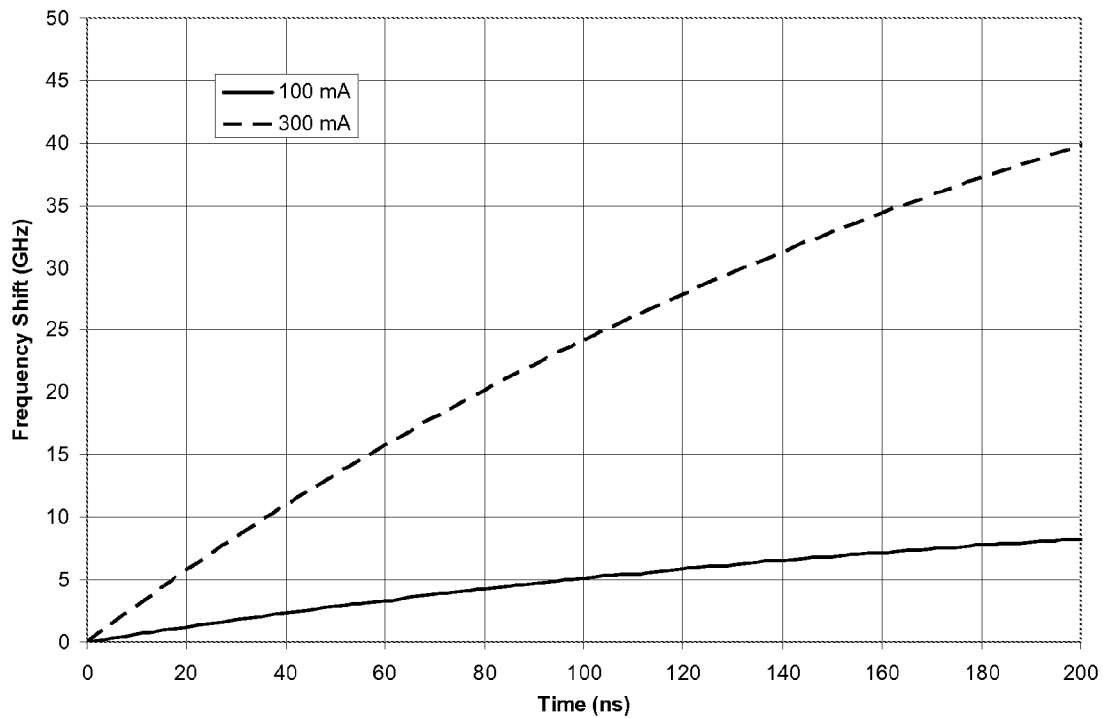
FIG. 3 is a plot of the seed source frequency shift versus time for two different drive currents in a fiber MOPA system according to an embodiment of the present invention.

FIG. 3 shows shift in the seed source frequency vs. time in a DBR laser at drive currents of 100 mA and 300 mA. In this example, the DBR laser used was a Model #EYP-DBR-1063-00025-2000-BFY01-0001 from Eagleyard Photonics of Berlin, Germany. DFB lasers have yielded similar results. The magnitude of frequency shift increases with increasing drive current. The increase in frequency shift with current is typically super linear. As may be seen from FIG. 3 the shape of the frequency shift curves is similar for both drive currents. In the examples illustrated in FIG. 3, total frequency shifts of 8 GHz and 40 GHz were obtained for 100 mA and 300 mA peak current pulses respectively.

Figure 4:
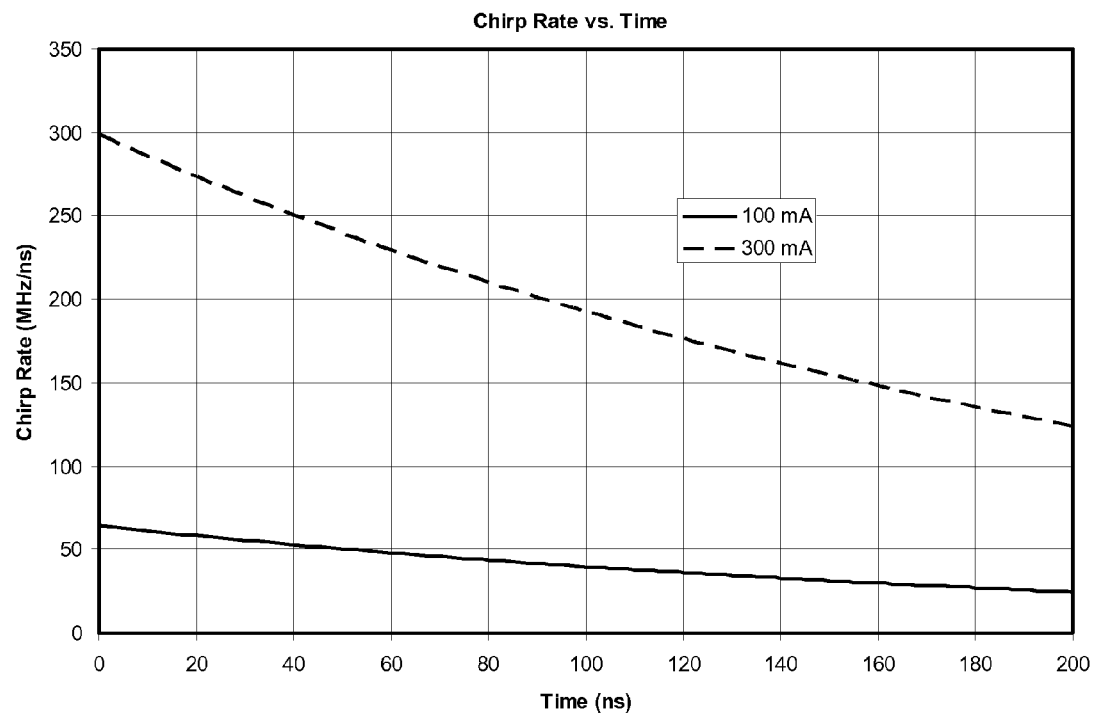
FIG. 4 is a plot of seed source frequency chirp rate versus time for two different drive currents in a fiber MOPA system according to an embodiment of the present invention.

One may take a derivative of the frequency shift vs. time data plotted in FIG. 3 to determine a frequency chirp rate (rate of frequency shift) as a function of time. Specifically, FIG. 4 depicts plots of frequency chirp rate versus time derived from the data used to plot frequency shift versus time in FIG. 3. As may be seen from FIG. 4, the chirp rate increases with increasing drive current. Specifically, for the 100 mA drive current the chirp rate varies from about 65 MHz/ns to 25 MHz/ns over the 200 ns applied current pulse. For the 300 mA drive current the chirp rate varies from about 300 MHz/ns to 125 MHz/ns. The threshold for Stimulated Brillouin Scattering is dependent on the chirp rate. Thus by appropriately chirping the seed source the SBS threshold may be increased above a level it would otherwise have for cw operation. In this manner the SBS threshold may be raised to a level higher than the power of the seed pulse radiation being amplified in the power amplifier. For example, if the time to build up SBS in the power amplifier 108 is about 10 nanoseconds (ns) and the SBS bandwidth for the gain medium of the power amplifier 108 is about 100 MHz, a chirp rate of about 10 MHz/ns or greater would yield a frequency shift of about 100 MHz or greater and thus will increase the SBS threshold. By controlling the chirp rate induced by the pulsed drive current the SBS threshold in the power amplifier 108 may be increased such that optical system 100 can operate over a broad parameter range without experiencing SBS.

Figure 5:
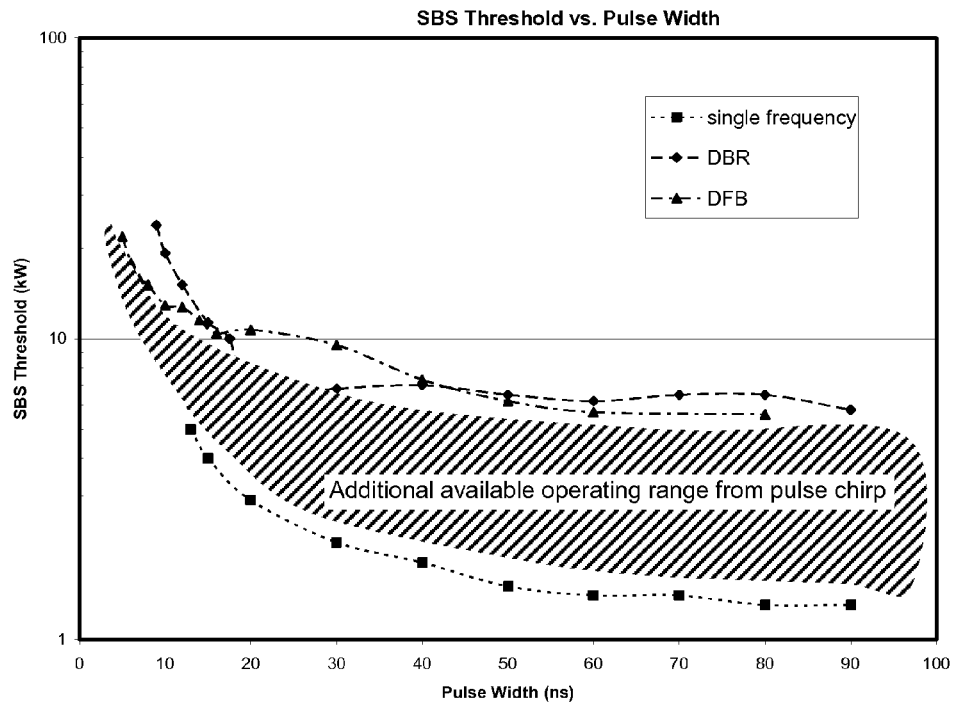
FIG. 5 is a plot of the SBS threshold versus pulse width with a frequency chirped seed source in a fiber MOPA system according to an embodiment of the present invention.

FIG. 5 illustrates the effect of chirping the seed source 102 on SBS threshold. Plots of SBS threshold versus pulse width are depicted for a counter pumped, fiber-based power amplifier. The fiber used was large mode area photonic crystal fiber available from Crystal Fibre A/S located in Birkenrød, Denmark. To generate the single frequency curve in this figure the seed source was a model #EYP-DBR-1063-00025-2000-BFY01-0001 DBR diode run in a cw mode with an external modulator to control the pulse width. To generate the other two curves in FIG. 5, DBR and DFB lasers were chirped by pulsing the drive current. As may be seen in FIG. 5, the chirp induced by current pulsing of both the DBR and DFB sources resulted in a significant increase in the SBS threshold compared to a single frequency source having no frequency chirp. The shaded area in FIG. 5 represents additional available operating range resulting from pulse chirping the seed radiation. The increase in SBS threshold is approximately a factor of four over a large operating range of pulse widths from several ns to approximately 100 ns.

To facilitate comparison of the DFB and DBR sources both the DBR and DFB diodes were driven using a peak current of 200 mA. This value is at or near the maximum rated cw operating drive current for the particular lasers used in this example. However, it is possible to operate the lasers at significantly higher drive currents further increasing chirp and raising the SBS threshold. The inventors have determined through experiment that DFB and DBR semiconductor lasers can be reliability operated at pulsed currents significantly larger than the rated cw operating current. Operation at currents five times rated cw current is possible at low duty and short pulse widths. By way of example, the duty cycle for the current pulse may be less than about 5%, more typically less than about 1%. Very low duty cycles, e.g., around 0.01% may be too low because of amplified stimulated emission (ASE) issues and excessive peak powers. However, it may be possible to operate the system 100 at very low duty cycles with reduced average power. The minimum pulse width may be limited, e.g., by the electronics used to drive the pulse of the laser diode. In one example, the minimum pulse width was about 2 nanoseconds. By way of example, and without limitation, the pulse duration τ may be less than about 100 ns. At these low duty cycles, the average heat dissipated by the semiconductor laser is less than the rated value, even though the pulsed current levels significantly exceed the rated cw operating current.

In embodiments of the invention that use semiconductor lasers as the seed source 102, pulsing the current at levels above the rated cw current may have two desirable effects. Specifically, the pulsing may increase the chirp, thereby increasing the SBS threshold in the power amplifier 108. In addition, driving the diode at currents above the rated cw level may produce higher power seed pulses 104, which may decrease the overall required gain in all subsequent amplifiers. This may obviate the need for one or more preamplifiers between the seed source 102 and the power amplifier 108 and allow the use of the seed pulses 104 as input pulses for the power amplifier 108. In addition, if the seed source 102 is a DBR, the diode may be driven using the phase and grating sections as well as just the normal gain section to get increased output power and chirp.

Figure 6A:
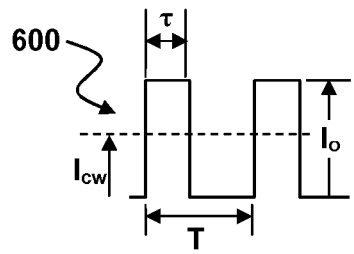
FIG. 6A illustrates an example of a current pulse applied to a semiconductor laser to chirp an output of the laser.

In some embodiments, the seed source chirp rate may be optimized by control of the amplitude of the current pulse. FIG. 6A depicts a square current pulse 600 that may drive the seed source 102. The pulse 600 may be characterized by period T and duration τ and a current amplitude $I_o$. By way of example, the period T may be selected such that the pulse repetition frequency (1/T) is between about 50 kilohertz (kHz) and about 100 megahertz (MHz). In FIG. 6A, the current amplitude $I_o$ in the pulse is constant over the pulse duration τ. To overdrive the seed source 102, the current amplitude $I_o$ may be greater than a rated cw current $I_{cw}$. By way of example, $I_o$ may be greater than $I_{cw}$ by about a factor of two. In some embodiments, $I_o$ may be greater than $I_{cw}$ by about a factor of five.

Figure 6B:
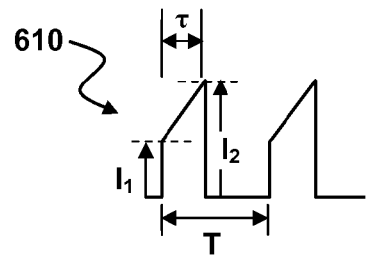
FIG. 6B illustrates an example of a shaped current pulse applied to a semiconductor laser to chirp an output of the laser and vary the power of the output pulse.

In some embodiments, the amplitude of the current may vary during the pulse, e.g., by increasing the current over the pulse duration τ to increase chirp and increase the SBS threshold. For example as shown in FIG. 6B a current pulse 610 may have an amplitude that increases from $I_1$ to $I_2$ during the pulse duration τ. In addition, the current pulses may be shaped so that the current amplitude varies during the pulse, but in a non-linear fashion. The varying of the current amplitude may be configured to increase the output power of the seed radiation 104 in a way that compensates for a depletion of gain in the power amplifier 108 over the duration, τ, of the pulse. Alternatively, any desired pulse shape may be used, e.g., triangular, sawtooth, Gaussian or other pulse shapes. Such pulse shaping may be used, e.g., to keep the power of the amplified output 109 of the power amplifier 108 more or less constant over the output pulse duration.

The optional pre-amplifiers 106a, 106b may amplify the seed pulses 104 from the seed source 102 to provide pre-amplified input pulses 107 to power amplifier 108. By way of example, the optional pre-amplifiers 106a, 106b may be fiber amplifiers, which may be either core-pumped or cladding-pumped. If there is more than one fiber pre-amplifier, the size of the core diameter in later stage pre-amplifiers may be increased relative to fiber pre-amplifier cores that are closer to the seed source 104. Such core configurations may increase SBS threshold in the pre-amplifiers 106a, 106b.

Figure 7:
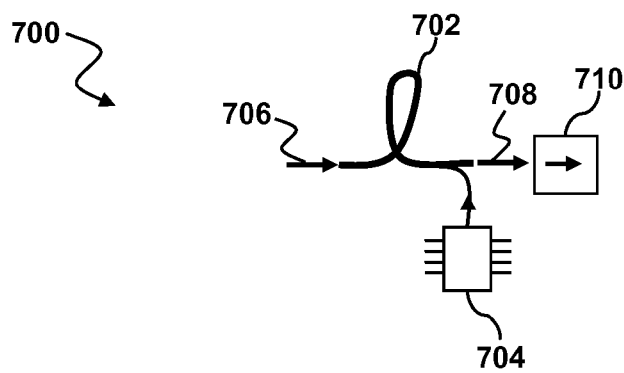
FIG. 7 is a schematic diagram of a fiber amplifier suitable for use in embodiments of the present invention.
Figure 8:
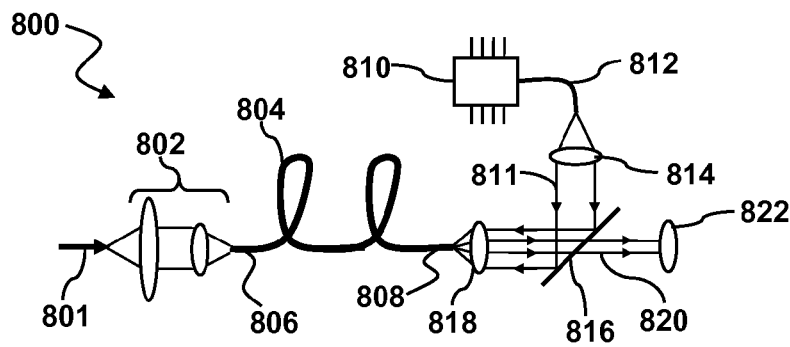
FIG. 8 is a schematic diagram of a fiber amplifier suitable for use in embodiments of the present invention.

The power amplifier 108 typically (though not invariably) experiences the highest optical powers and thus is typically the stage of the system 100 whose performance is limited by SBS By way of example, the power amplifier 108 may be an optical fiber amplifier. In certain embodiments of the invention it is desirable to counter pump the power amplifier 108 in order to reduce the propagation length of high power, amplified light in the amplifier. There are numerous optical fiber amplifier configurations that may be used for the power amplifier 108. FIG. 7 and FIG. 8 illustrate two examples, among others, of possible optical fiber amplifier configurations.

FIG. 7 depicts an example of a fiber pre-amplifier 700 having an optical fiber 702 and a pumping source 704. The optical fiber 702 includes cladding and a doped core. The core of the fiber 702 may be, e.g., about 6 microns in diameter. The fiber 702 may be a polarization preserving or single polarization fiber. The fiber 702 may have a relatively large mode area compared to standard telecommunications fibers, which may have core diameters ranging from about 5 microns to about 10 microns. Input radiation 706 that is to be amplified is coupled to the core. Pumping radiation from the pumping source 704 is also typically coupled to the core, but may alternatively be coupled to the cladding. By way of example, the input radiation 706 may originate from a seed source. Dopant atoms, e.g., rare earth elements such as ytterbium (Yb), erbium (Er), neodymium (Nd), holmium (Ho) samarium (Sm) and thulium (Tm), or combinations of two or more of these, in the core of the fiber 702 absorb energy from the pumping radiation. Those of skill in the art will be familiar with rare-earth-doped fiber amplifiers (REDFA) schemes and architectures.

The input radiation 706 stimulates emission of radiation from the dopant atoms. The stimulated radiation has the same frequency and phase as the input radiation. The result is an amplified output 708 having the same frequency and phase as the input radiation but a greater optical intensity. An optical isolator 710 may be optically coupled to an output end of the fiber 702 to prevent radiation from undesirably entering the fiber 702 from its output end, e.g., as a result of reflection.

FIG. 8 depicts one possible example, among others, of a fiber power amplifier 800 that may be used in as the optical power amplifier 108 depicted in FIG. 2. The fiber power amplifier 800 generally receives an optical signal 801 that is to be amplified. The optical signal 801 may originate from a seed source and may be pre-amplified between the seed source and the fiber power amplifier 800. An optical coupler 802, e.g., having a pair of relay lenses, may couple the optical signal 801 into an optical fiber 804 at a first end 806. Preferably, the fiber 804 is long enough that it absorbs a sufficient percentage of the pumping radiation (e.g., about 90% or more). In some embodiments, it is desirable for the fiber 804 to have a core diameter suitable for a large mode area (LMA) fiber. It is further desirable that fiber 804 be dual clad, with an inner cladding diameter and acceptance angle suitable for accepting high-power, multi-mode pump radiation. By way of example, the core of the fiber 804 may be doped with a rare earth element, such as erbium (Er), ytterbium (Yb) or neodymium (Nd). The fiber 804 may be a polarization preserving or single polarization fiber.

A pumping source 810 supplies pumping radiation 811 to the fiber 804 at a second end 808. The pumping source 810 typically contains one or more high power laser diodes. These laser diodes can be either in the form of a single-emitter or a monolithic bar, containing multiple single emitters. Specific examples of suitable commercially available laser diodes include a model LIMO110-F400-DL980 laser diode, from Lissotschenko Mikrooptik (LIMO) GmBH of Dortmund, Germany and an Apollo F400-980-4 laser diode from Apollo Instruments of Irvine, Calif. Alternatively, the pumping source 810 may be an array of single emitters optically coupled together, for example a model L3 980 nm pump package available from JDS Uniphase of Milpitas, Calif.

Preferably, the source 810 is a multimode source and the fiber 804 has a multi-mode inner cladding. In the power amplifier 800, the pumping radiation is typically coupled to the inner cladding of the fiber 804. If the pumping radiation 811 is single-mode, then the pumping radiation 811 may alternatively be coupled directly to the core of the fiber 804. By way of example, a fiber 812 may couple the pumping radiation 811 from the pumping source 810 to a collimator lens 814. The pumping radiation 811 may be coupled to either end of the fiber 804 or to both ends. In some embodiments it is advantageous to situate the pumping source 810 proximal to the seed source, and connect the pumping source 810 to an output head via fiber 812, which may be a multi-mode fiber. Such an arrangement reduces the size and the heat load in the output head.

The pumping radiation 811 emerges from the fiber 812 as a divergent beam. The collimator lens 814 focuses the divergent beam into a collimated beam. A wavelength-selective reflector 816 (e.g., a dichroic filter) reflects the pumping radiation toward a converging lens 818, which focuses the collimated pumping radiation into the second end 808 of the fiber 804. Dopant atoms in the core of the fiber 804 absorb the pumping radiation 811 stimulating emission of amplified output radiation 820 having the same frequency and phase as the optical signal 801 but with an amplified optical intensity. Amplified output radiation 820 diverges as it emerges from the second end 808 of the fiber 804. The wavelength-selective reflector 816 is configured to transmit the amplified output radiation 820. By way of example, the frequency selective filter 816 may be a dichroic filter having a stop band selected to reflect radiation in the frequency range of the pumping radiation 811 (e.g., about 976 nanometers) and a passband selected to transmit radiation in the frequency range of the amplified output radiation 820 (e.g., about 1.05 microns). The amplified output radiation 820 may then be focused by an output coupler lens 822.

Figure 9:
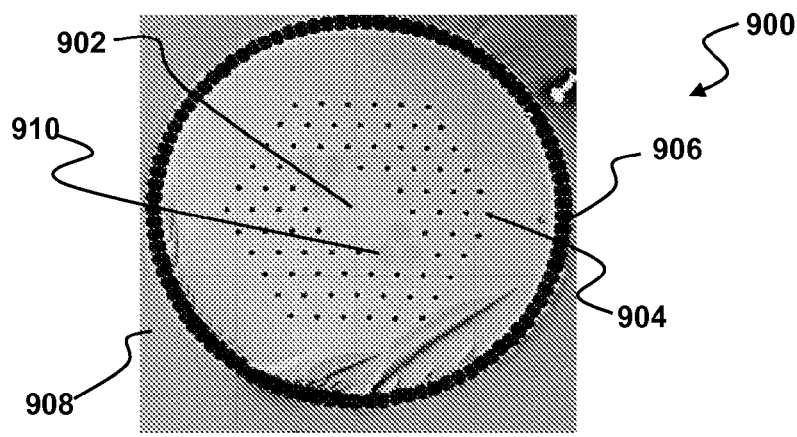
FIG. 9 is a photomicrograph of a cladding pumped, photonic crystal fiber that may be used in a power amplifier in a fiber MOPA system.

In embodiments of the present invention photonic crystal fiber may be used as the gain medium in the power amplifier 108. In such cases it is desirable to use a photonic crystal fiber with a large mode area. Photonic crystal fiber may also be used for the pre-amplifiers 106a, 106b. FIG. 9 shows photomicrograph of an example of a photonic crystal fiber 900 that may be used in the power amplifier 108. The photonic crystal fiber 900 is characterized by a doped core 902 having a pattern of voids 904 that surround the core 902 and run the length of the fiber 900. The pattern of voids 904 is configured to guide light in the core and thus provides an inner cladding. The core 902 and pattern of voids 904 may be surrounded by an air cladding 906 formed by a second pattern of voids that run the length of the fiber 900. The air cladding 906 provides an outer cladding for pump light. The air cladding 906 may be characterized by a refractive index that is different from that of the core 902. The air cladding 906 separates the core 902 and pattern of voids 904 from a jacketing layer 908. The fiber 900 may be a polarization preserving or single polarization fiber. By way of example, and without loss of generality, the fiber depicted in FIG. 9 is single polarization at 1064 nm. As shown in the example depicted in FIG. 9, the fiber 900 may include stress members 910, which give rise to the fiber polarizing properties.

Figure 10:
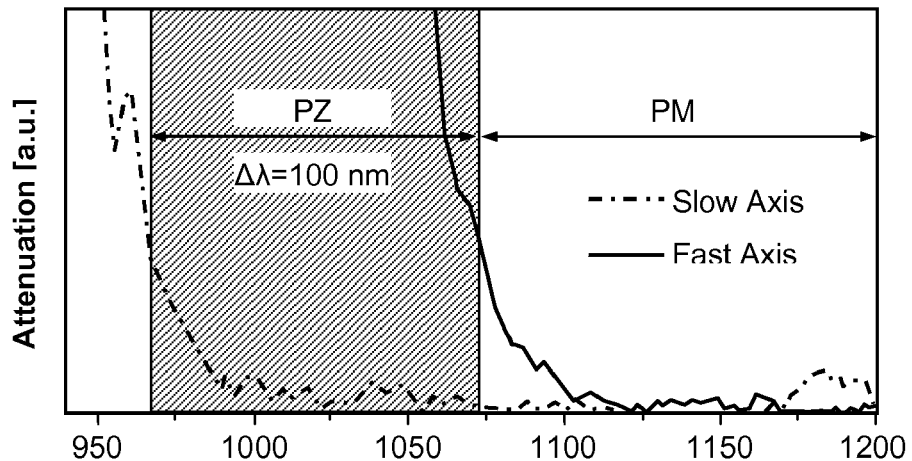
FIG. 10 is a plot of optical attenuation versus optical wavelength for a single polarization photonic crystal fiber may be used in a power amplifier in a fiber MOPA system.

An example of a suitable commercially-available fiber is Model #DC-200/41-PZ-Yb-3 from Crystal Fibre Birkenrød, Denmark. This particular fiber may be characterized by a mode field diameter of approximately 27 microns and a mode field area of 580 micron$^2$. FIG. 10 shows the polarization and wavelength properties of this particular type of photonic crystal fiber. As may be seen from FIG. 10, fiber attenuation varies strongly with wavelength and polarization. Specifically, for the slow polarization axis the attenuation is relatively high for wavelengths shorter than approximately 970 nm as indicated by the dash-dot curve. For the fast polarization axis the attenuation is relatively high for wavelengths shorter than approximately 1070 nm as indicated by the solid curve. From FIG. 10, it may be seen that for operation at wavelengths between approximately 970 nm and 1070 nm the fiber is single polarization (PZ) and that for operation at wavelengths longer than 1070 nm for fiber is polarization maintaining (PM). Thus, where single polarization operation is desired such may be obtained by operation in either range; however, operation in the single polarization region is preferred since it allows relaxed launch conditions on the input signal polarization.

The advantages of using photonic crystal fiber in the power amplifier 108 of the system 100 may be explained partly in terms of the standard model of SBS threshold. According to a standard formula for cw operation, the SBS threshold may be calculated by:

$$g_B * P * L / A = 21, \text{ where}$$

$g_B$=Brillouin scattering gain, a material constant
P=optical power
L=fiber length
A=fiber mode area For details of the formula see, e.g., *Nonlinear Fiber Optics* by Govind Agrawal p. 361

Although the cw model is not applicable for short pulses when the optical frequency is chirped or broader than the SBS bandwidth, the model still gives qualitative guidance for the effect of chirped pulses on the SBS threshold. Specifically, from the above equation it may be seen that to increase the SBS threshold it is desirable to (a) increase the mode area A by using large mode area fiber and (b) decrease the fiber length L With respect to (b) it is noted that in a counter pumped amplifier the effective pump absorption length, the distance over which the pump light is attenuated by a factor of 1/e, is more important than the physical fiber length. The pump absorption length may be minimized by using a highly doped core, a small diameter inner cladding, and pumping at the wavelength that has the highest absorption coefficient. For Yb doped glass fiber pumping at a wavelength of approximately 976 nm yields the shortest effective pump absorption length.

To the best of the inventors' knowledge, it has not been previously recognized that photonic crystal fiber has desirable properties that can increase its SBS threshold. Normal fiber, which uses a refractive index difference between the core and cladding to guide light, may also serve as a guide for Brillouin scattered sound waves. As with light, guiding the generated Brillouin sound waves may eliminate the natural spreading of the waves and serve to concentrate the waves in the fiber core. This guiding is believed to be responsible for reducing the SBS threshold. The inventors have recognized that photonic crystal fiber may be fabricated so that it does not guide the Brillouin scattered light. Specifically, the photonic crystal fiber may be configured so that it does not guide Brillouin scattered radiation originating in the photonic crystal fiber due to Brillouin scattering of amplified pulses and/or input pulses. The Brillouin wavelength (the wavelength of Brillouin-scattered radiation) is half the optical wavelength in the material. Brillouin scattering of 1064 nm wavelength light would produce Brillouin scattered radiation having a wavelength of 532 nm. Inspecting FIG. 10 reveals that 532 nm optical radiation is highly attenuated, not guided, in the fiber 900. If the same mechanism guides the Brillouin sound waves as the optical waves, it may be inferred that the sound waves are also not guided. Based on such observations, the inventors have empirically determined that the lossy nature of the fiber for Brillouin scattered sound waves may be expected to increase the SBS threshold by approximately a factor of three.

Figure 11:
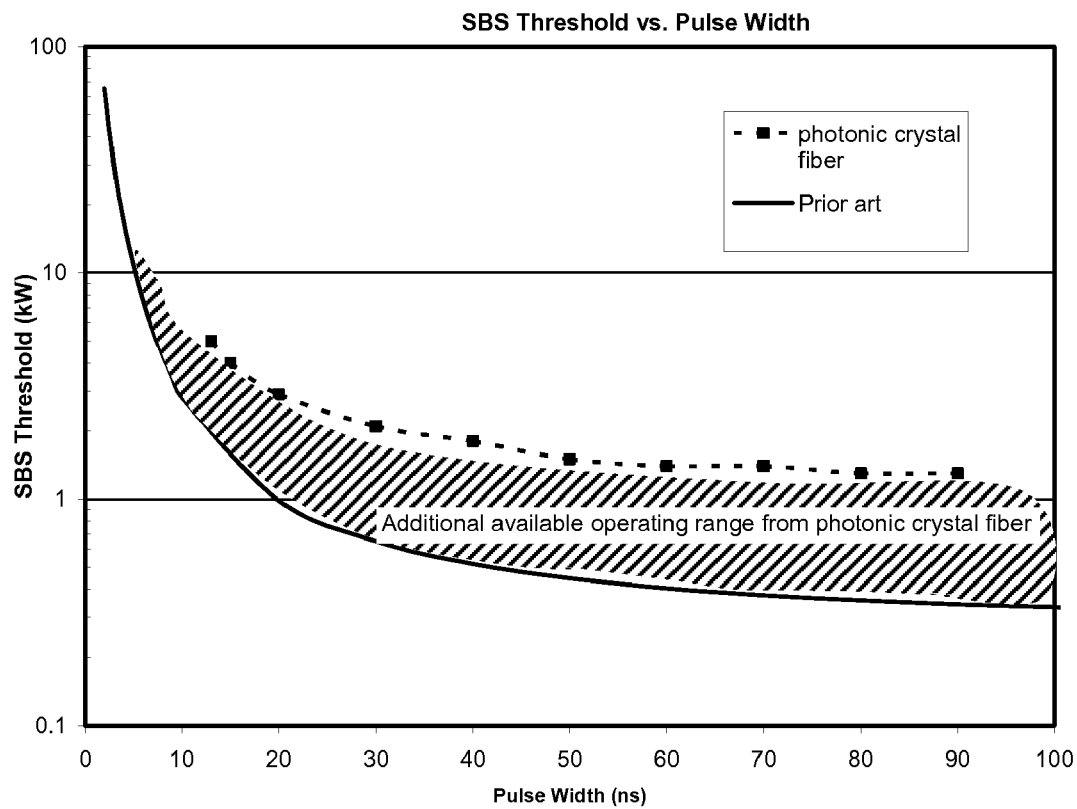
FIG. 11 is a comparison between the prior art using a standard fiber and the current invention using a photonic crystal fiber with no chirp on the seed source.

FIG. 11 compares the prior art using a conventional, step-index fiber and an embodiment of the present invention that uses a photonic crystal fiber in the power amplifier 108, but with no chirp on the seed source 102. The solid line shows the SBS threshold for a conventional fiber and the dashed line indicates the SBS threshold for a photonic crystal fiber of the type described above. To generate this plot the intensity vs. pulse width information given in U.S. Pat. No. 7,039,076 has been converted to a peak power by multiplying the intensity by an assumed 580 micron$^2$ mode field area. The comparison illustrated by FIG. 11 assumes a single frequency, non-chirped, seed source 102. The shaded area indicates potentially available additional operating range resulting from the use of photonic crystal fiber. FIG. 11 suggests approximately a factor of three increase in the SBS threshold over a wide operating range of pulse widths from approximately several ns to 100 ns.

Figure 12:
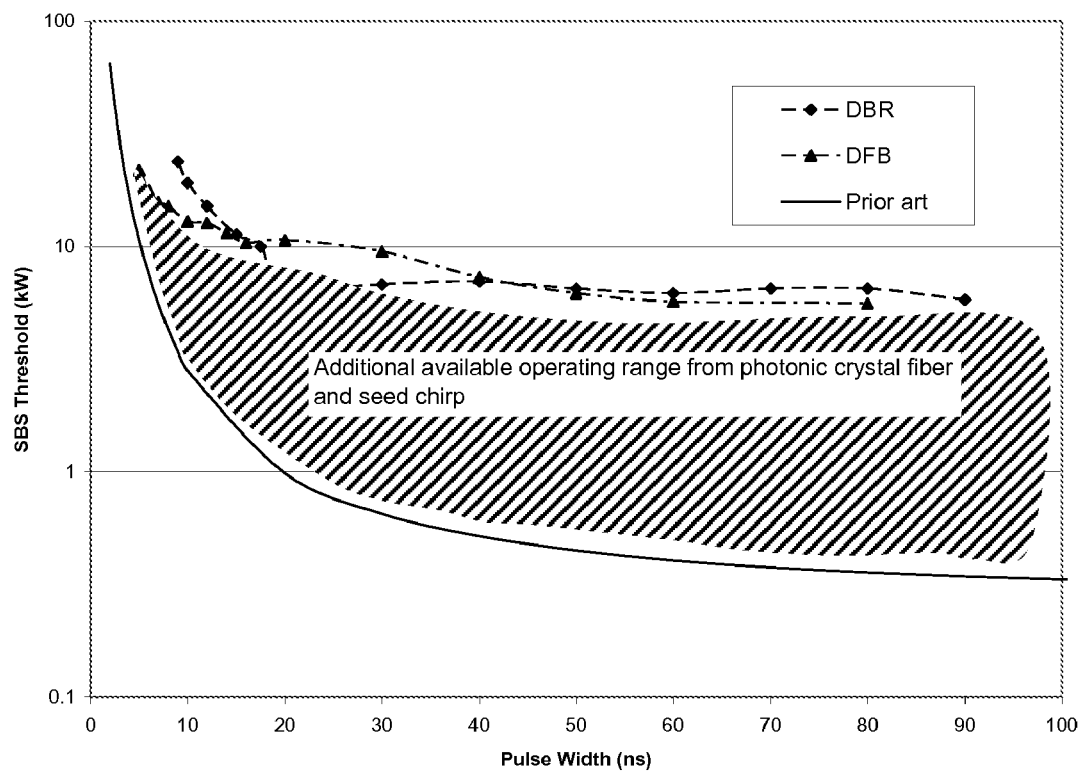
FIG. 12 is a plot of SBS threshold vs. pulse width illustrating the improvement from using both seed frequency chirp and a photonic crystal fiber.

In certain embodiments of the present invention, seed source chirp may be combined with the use of photonic crystal fiber to realize approximately an order of magnitude increase in the SBS threshold. By way of example, FIG. 12 illustrates the improvement when the effects of chirped pulses from the seed source 102 and photonic crystal fiber in the power amplifier 108 are both taken into account. The solid line shows the SBS threshold for a conventional fiber in the amplifier 108 and no chirped pulsing of the seed source 102. To generate this line the intensity vs. pulse width information given in U.S. Pat. No. 7,039,076 has been converted to a peak power by multiplying the intensity by an assumed 580 micron$^2$ mode field area. The dashed line indicates the SBS threshold for a photonic crystal fiber of the type described above in the power amplifier 108 in conjunction with chirped pulsing of a DBR laser as the seed source 102. The dash-dotted line indicates the SBS threshold for a photonic crystal fiber of the type described above in the power amplifier 108 in conjunction with chirped pulsing of a DFB laser as the seed source 102. The shaded area indicates potential additional available operating range from the combination of chirped pulsing of the seed source 102 and photonic crystal fiber in the power amplifier 108. It is noted that one may further control the SBS threshold level by driving seed source above its cw rating to increase the seed source chirp. As may be seen from FIG. 12, the SBS threshold may continue to remain relatively high for pulse widths longer than 100 ns. Furthermore, as illustrated in FIG. 4 the seed source 102 may continue to chirp for pulse widths longer than 100 ns.

Figure 13:
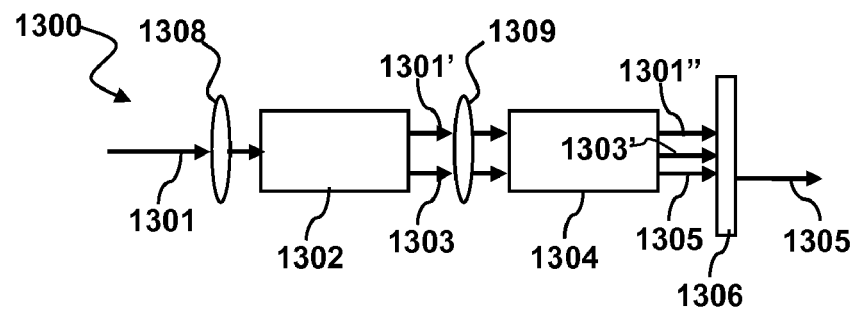
FIG. 13 is a schematic diagram of a third harmonic generator suitable for use as a wavelength converter in embodiments of the present invention.

Embodiments of the present invention allow for longer pulse durations, τ, in the amplified pulses. This is particularly advantageous for applications involving wavelength conversion of the amplified output 109 using the wavelength converter 110. There are a number of possible wavelength converter configurations that may be used in conjunction with embodiments of the present invention. FIG. 13 depicts one example, among others, of a wavelength converter 1300 that may be used as the wavelength converter 110 in the system 100 of FIG. 2. In this example, the wavelength converter 1300 is a third-harmonic generator. The wavelength converter 1300 generally includes first and second non-linear crystals 1302, 1304. Examples of suitable non-linear crystals of lithium niobate (LiNbO$_3$), lithium triborate (LBO), beta-barium borate (BBO), cesium lithium borate (CLBO), lithium tantalite, stoichiometric lithium tantalite (SLT) potassium titanyl phosphate (KTiOPO$_4$ also known as KTP), ADA, ADP, CBO, DADA, DADP, DKDP, DLAP, DRDP, KABO, KDA, KDP, or LFM and isomorphs thereof, periodically poled materials such as periodically poled lithium niobate (PPLN), periodically poled lithium tantalate and periodically poled stoichiometric lithium tantalate (PPSLT). Such non-linear materials are available commercially, e.g., from Fujian Castech Crystals of Fujian, China. In addition, nonlinear fiber may be used for wavelength conversion.

The first non-linear crystal 1302 receives amplified input radiation 1301 from a power amplifier. The input radiation 1301 is characterized by a characteristic wavelength λ corresponding to an optical frequency ω. The first non-linear crystal 1302 is phase-matched for second harmonic generation. Phase-matching may be controlled by adjusting a temperature of the first non-linear crystal. Specifically, a portion of the input radiation 1301 reacts in the non-linear crystal 1302 to produce second-harmonic radiation 1303, which is characterized by an optical frequency 2ω. The second harmonic radiation 1303 and a remaining portion 1301' of the input radiation 1301 couple to the second non-linear crystal 1304. The second non-linear crystal 1304 is phase-matched for sum frequency generation between radiation of optical frequency 2ω and radiation of optical frequency ω. Specifically, in the second non-linear crystal 1304, the second harmonic radiation 1303 and the remaining portion 1301' of the input radiation 1301 interact in the second non-linear crystal 1304 to produce third-harmonic radiation 1305 characterized by optical frequency 3ω. The third harmonic radiation 1305 exits the second non-linear crystal 1304 to provide the frequency-converted output.

If the conversion efficiency of the second non-linear crystal is less than 100% some left-over portion 1301" of the input radiation 1301 may also exit the second non-linear crystal 1304. The wavelength converter 1300 may include an optical filter 1306 (e.g., a dichroic filter) that reflects the left-over portion 1301" and a left-over portion 1303' of the second-harmonic radiation 1303 while transmitting the third harmonic radiation 1305. The left-over portions 1301", 1303' may be directed to an optical trap or otherwise disposed of as waste light. Alternatively optical filter 1306 can be configured to selectively pass more than one output wavelength.

For example, the first crystal 1302 may double the frequency of 1.04 micron to 1.08 micron wavelength input radiation 1301 to produce second harmonic radiation 1303 having a vacuum wavelength of about 520 nm to about 540 nm. The second non-linear crystal 1304 sums the second harmonic radiation 1303 with the remaining portion of the input radiation 1301' to produce third harmonic radiation 1305 having a vacuum wavelength ranging from about 340 nm to about 360 nm. By way of example, and without loss of generality, the first crystal 1302 may double 1.064-micron input radiation 1301 to generate 532 nm second-harmonic radiation 1303. The second crystal sums the remaining portion of the input radiation 1301' with the second-harmonic radiation 1303 to produce 355 nm third-harmonic radiation 1305.

It is noted that in many wavelength-conversion processes, such as second-harmonic generation and third-harmonic generation, the wavelength-converted output (e.g., second-harmonic radiation 1303 or third-harmonic radiation 1305) often has a shorter pulse duration, τ', than the pulse duration, τ, of the input radiation 1301.

It is noted that although FIG. 13 depicts an example of a third-harmonic generator, those of skill in the art will recognize that other non-linear wavelength converters, such as second-harmonic generators, fourth harmonic generators, other higher harmonic generators, sum-frequency generators, difference-frequency generators, optical parametric oscillators, optical parametric amplifiers, and the like could be use as the wavelength converter 110 in optical system 100. For example the wavelength converter 1300 may be configured as a second harmonic generator if the second non-linear crystal 1304 is omitted.

Figure 14:
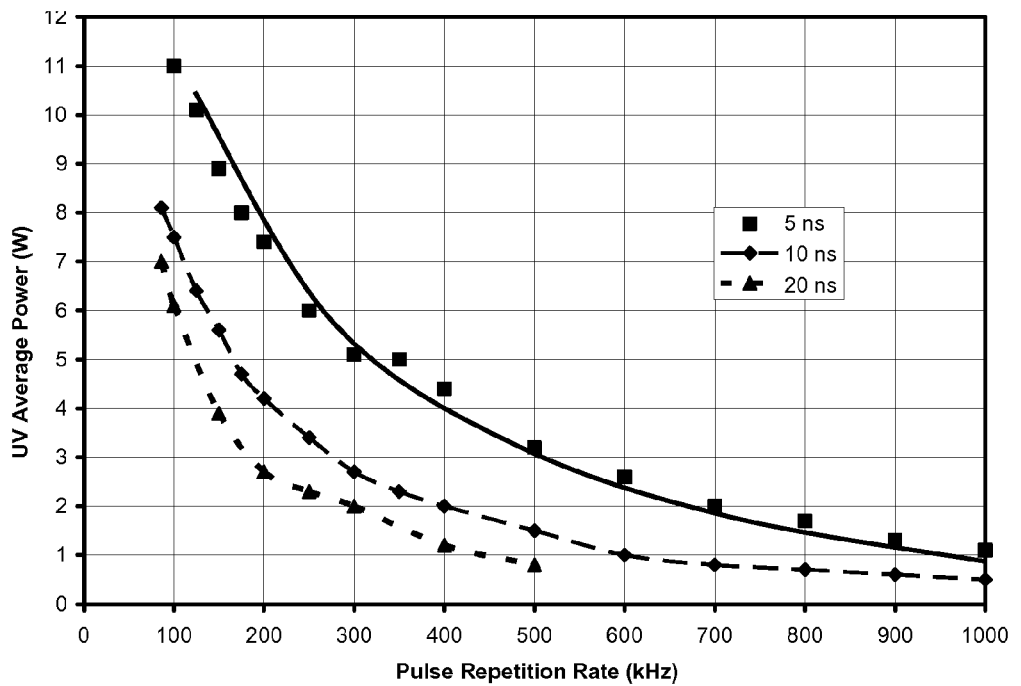
FIG. 14 is a plot of average ultra-violet (UV) power versus pulse repetition rate for several pulse widths.

The inventors have demonstrated this architecture using a 15-mm long piece of appropriately oriented LBO as the first non-linear crystal 1302 for second harmonic conversion and a 20-mm long piece of appropriately oriented LBO as the second non-linear crystal 1304 for third harmonic conversion. A lens 1308 may be used to focus 1064-nm wavelength input radiation 1301 to approximately a 45-micron waist radii in the first crystal 1302. A subsequent lens 1309 may be used to focus both 1064-nm wavelength input radiation 1301 and 532-nm wavelength second harmonic radiation 1303 to approximately a 45-micron waist radii in second crystal 1304. Using such a third-harmonic generator, the inventors have demonstrated use of chirped seed source 102 with photonic crystal fiber in the power amplifier 108 to produce 11 W of 355 nm, UV radiation. FIG. 14 illustrates the average power of UV radiation vs. pulse repetition rate. The maximum peak IR power in this graph is greater than 50 kW. This is more than an order of magnitude higher than could be obtained using the prior art. The conversion efficiency from 1064 nm to 355 nm at this point is approximately 50%.

Figure 15:
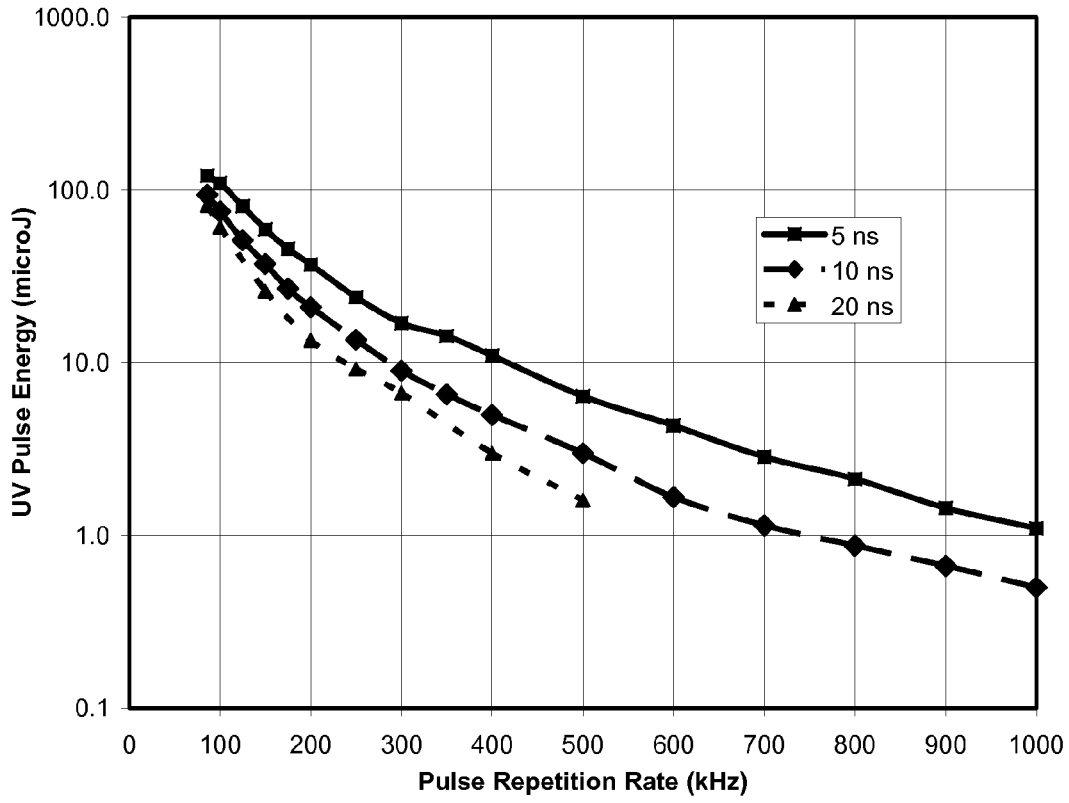
FIG. 15 is a plot of pulse energy as a function of pulse repetition rate for three different pulse widths.

For many applications, the pulse energy is often of more interest than the average or peak pulse power. Total pulse energy may be defined as the integral of the instantaneous pulse power with respect to time over the duration of the pulse. Embodiments of the present invention may generate pulses having wavelength converted total pulse energy greater than about 1 microjoule (μJ) or greater than about 10 μJ. By way of example, FIG. 15 illustrates plots of pulse energy versus pulse repetition rate for different pulse durations. The maximum pulse energy obtained at a 86 kHz pulse repetition rate for 20 ns long pulse was 255 μJ in IR at 1064 nm and 81 μJ in the UV at 355 nm.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for generating a pulsed optical signal, comprising:

generating one or more chirped input pulses with a laser seed source by pulsing a drive current applied to a semiconductor diode laser with square current pulses characterized by a repetition rate between about 50 kilohertz and about 100 Megahertz and a duty cycle of less than about 5%, wherein the input pulses are characterized by a pulse duration τ and a frequency chirp wherein τ is greater than about 2 nanoseconds;

optically coupling the one or more chirped input pulses from the laser seed source into a photonic crystal fiber optical amplifier; and amplifying the input pulses with the photonic crystal fiber optical amplifier to produce one or more amplified pulses characterized by a peak power P greater than about 1 kilowatt, wherein the frequency chirp and the photonic crystal fiber are selected such that a threshold for stimulated Brillouin scattering (SBS) in the photonic crystal fiber is greater than the peak power P, wherein pulsing the drive current increases a chirp rate of the frequency chirp by an amount sufficient to raise the threshold for SBS of the optical amplifier above a peak power for the optical amplifier.

2. The method of claim 1, further comprising wavelength-converting the amplified pulses to produce one or more wavelength-converted pulses.

3. The method of claim 2 wherein the wavelength-converted pulses are characterized by pulse durations $\tau'$ that are shorter than the pulse duration $\tau$ of the seed pulses.

4. The method of claim 2 wherein the wavelength-converted pulses are characterized by a pulse energy greater than about 1 microjoule.

5. The method of claim 2 wherein the wavelength-converted pulses are characterized by a pulse energy greater than about 10 microjoules.

6. The method of claim 1 wherein the peak power P is greater than about 10 kilowatts.

7. The method of claim 1 wherein the pulse duration is between about 2 nanoseconds and about 100 nanoseconds.

8. The method of claim 1 wherein a duty cycle is less than about 1%.

9. The method of claim 1 wherein the frequency chirp is characterized by a chirp rate greater than about 10 MHz/ns.

10. The method of claim 1 wherein the frequency chirp is characterized by a chirp rate greater than about 100 MHz/ns.

11. The method of claim 1 wherein the laser seed source includes a distributed Bragg reflector (DBR) type semiconductor diode laser.

12. The method of claim 1 wherein the laser seed source includes a distributed feedback (DFB) type semiconductor diode laser.

13. The method of claim 1 wherein generating one or more chirped input pulses with the laser seed source includes driving the semiconductor diode laser in a pulsed mode at a current greater than a specified continuous wave (cw) current of the semiconductor diode laser.

14. The method of claim 13 wherein generating one or more chirped input pulses with the laser seed source includes driving the semiconductor diode laser in a pulsed mode at a current greater than about two times the specified cw current.

15. The method of claim 13 wherein generating one or more chirped input pulses includes driving the semiconductor diode laser in a pulsed mode at a current greater than about five times the specified cw current.

16. The method of claim 1 wherein the photonic crystal amplifier is configured to support a single transverse mode of radiation.

17. The method of claim 16 wherein the photonic crystal amplifier is configured to support a single polarization.

18. An apparatus for generating a pulsed optical signal, comprising:
a laser seed source configured to generate one or more chirped seed pulses by pulsing a drive current applied to a semiconductor diode laser with square current pulses characterized by a repetition rate between about 50 kilohertz and about 100 Megahertz and a duty cycle of less than about 5%, wherein the one or more chirped seed pulses are characterized by a pulse duration $\tau$ and a frequency chirp, wherein $\tau$ is greater than about 2 nanoseconds; and
a photonic crystal fiber optical amplifier optically coupled to the laser seed source, wherein the photonic crystal fiber optical amplifier is configured to amplify input pulses based on the seed pulses and thereby produce one or more amplified pulses characterized by a peak power P greater than about 1 kilowatt,
wherein the frequency chirp and the photonic crystal fiber are selected such that a threshold for stimulated Brillouin scattering (SBS) in the photonic crystal fiber is greater than the peak power P, wherein pulsing the drive current increases a chirp rate of the frequency chirp by an amount sufficient to raise the threshold for SBS of the optical amplifier above a peak power for the optical amplifier.

19. The apparatus of claim 18, further comprising a wavelength converter optically coupled to the photonic crystal fiber optical amplifier, wherein the wavelength converter is configured to wavelength-convert the amplified pulses to produce one or more wavelength converted pulses.

20. The apparatus of claim 19 wherein the wavelength converter is configured to produce wavelength-converted pulses characterized by pulse duration $\tau'$ shorter than the pulse duration $\tau$ of the seed pulses.

21. The apparatus of claim 19 wherein the wavelength converter is configured to produce wavelength-converted pulses characterized by a pulse energy greater than about 1 microjoule.

22. The apparatus of claim 19 wherein the wavelength converter is configured to produce wavelength-converted pulses characterized by a pulse energy greater than about 10 microjoules.

23. The apparatus of claim 18 wherein the photonic crystal amplifier is configured such that the peak power P is greater than about 10 kilowatts.

24. The apparatus of claim 18 wherein the laser seed source is configured such that the pulse duration $\tau$ is between about 2 nanoseconds and about 100 nanoseconds.

25. The apparatus of claim 18 wherein the semiconductor diode laser is configured to produce the square current pulses with a duty cycle of less than about 1%.

26. The apparatus of claim 18 wherein the laser seed source is configured such that the frequency chirp is characterized by a chirp rate greater than about 10 MHz/ns.

27. The apparatus of claim 18 wherein the laser seed source is configured such that the frequency chirp is characterized by a chirp rate greater than about 100 MHz/ns.

28. The apparatus of claim 18 wherein the photonic crystal fiber amplifier includes an optical fiber made of a photonic crystal material having therein one or more voids extending in a direction parallel to a longitudinal axis of the fiber, wherein the one or more voids are configured to guide one or more modes of optical radiation in the fiber.

29. The apparatus of claim 18, further comprising one or more optical preamplifiers optically coupled between the laser seed source and the photonic crystal fiber optical amplifier.

30. The apparatus of claim 18 wherein the laser seed source is a distributed Bragg reflector (DBR) type semiconductor diode laser.

31. The apparatus of claim 18 wherein the laser seed source is a distributed feedback (DFB) type semiconductor diode laser.

32. The apparatus of claim 18 wherein the laser seed source includes a an electrical drive circuit configured to drive the semiconductor diode laser in a pulsed mode at a current greater than a specified continuous wave (cw) current of the semiconductor diode laser.

33. The apparatus of claim 32 wherein the electrical drive circuit is configured to drive the semiconductor diode laser in a pulsed mode at a current greater than about two times the specified cw current.

34. The apparatus of claim 32 wherein the electrical drive circuit is configured to drive the semiconductor diode laser in a pulsed mode at a current greater than about five times the specified cw current.

35. The apparatus of claim 18 wherein the laser seed source includes an electrical drive circuit configured to drive the semiconductor diode laser with a nonuniform current to maintain a desired chirp rate of the frequency chirp.

36. The apparatus of claim 18 wherein the photonic crystal amplifier is configured to support a single transverse mode of radiation.

37. The apparatus of claim 18 wherein the photonic crystal amplifier is configured to support a single polarization.

38. The apparatus of claim 18 wherein the photonic crystal fiber is configured so that it does not guide Brillouin scattered radiation originating in the photonic crystal fiber due to Brillouin scattering of the amplified pulses and/or input pulses.

39. A method for generating a pulsed optical signal, comprising:
  generating one or more chirped input pulses by pulsing a drive current applied to a semiconductor diode laser with square current pulses characterized by a repetition rate between about 50 kilohertz and about 100 Megahertz and a duty cycle of less than about 5%, wherein the one or more chirped seed pulses are, wherein the input pulses are characterized by a characteristic vacuum wavelength $\lambda$, a spectral linewidth $\delta f$, a pulse duration $\tau$, frequency shift $\Delta f$ and frequency shift rate $\Delta f/\Delta t$, wherein $\tau$ is greater than about 2 nanoseconds; and
  amplifying the input pulses with a photonic crystal fiber optical amplifier to produce one or more amplified pulses characterized by a peak power P greater than about 1 kilowatt, wherein $\lambda$, $\delta f$, $\tau$, $\Delta f$, $\Delta f/\Delta t$ and the photonic crystal fiber are selected such that a threshold for stimulated Brillouin scattering (SBS) in the photonic crystal fiber is greater than the peak power P.

40. An apparatus for generating a pulsed optical signal, comprising:
  a laser seed source configured to generate one or more chirped seed pulses by pulsing a drive current applied to a semiconductor diode laser with square current pulses characterized by a repetition rate between about 50 kilohertz and about 100 Megahertz and a duty cycle of less than about 5%, wherein the one or more chirped seed pulses are characterized by a characteristic vacuum wavelength $\lambda$, a spectral linewidth $\delta f$, a pulse duration $\tau$, frequency shift $\Delta f$ and frequency shift rate $\Delta f/\Delta t$, wherein $\tau$ is greater than about 2 nanoseconds; and
  a photonic crystal fiber optical amplifier optically coupled to the laser seed source, wherein the photonic crystal fiber optical amplifier is configured to amplify input pulses based on the seed pulses and thereby produce one or more amplified pulses characterized by a peak power P greater than about 1 kilowatt,
  wherein $\lambda$, $\delta f$, $\tau$, $\Delta f$, $\Delta f/\Delta t$ and the photonic crystal fiber are selected such that a threshold for stimulated Brillouin scattering (SBS) in the photonic crystal fiber is greater than the peak power P.

41. The method of claim 1 wherein the peak power P is greater than a threshold for Brillouin scattering of the chirped input pulses in a conventional step-index fiber having the same mode field area and pump absorption length as the photonic crystal fiber.

* * * * *